United States Patent
Maher

(10) Patent No.: US 8,143,993 B2
(45) Date of Patent: Mar. 27, 2012

(54) METHOD AND CIRCUIT FOR RECYCLING TRIMMED DEVICES

(75) Inventor: Gregory A. Maher, Cape Elizabeth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 420 days.

(21) Appl. No.: 12/511,496

(22) Filed: Jul. 29, 2009

(65) Prior Publication Data

US 2011/0025452 A1    Feb. 3, 2011

(51) Int. Cl.
*H01C 17/24* (2006.01)
(52) U.S. Cl. ......................................................... 338/195
(58) Field of Classification Search .................. 338/195; 438/14, 132; 257/48, 529
See application file for complete search history.

(56) References Cited

U.S. PATENT DOCUMENTS

| | | | |
|---|---|---|---|
| 5,243,319 A | 9/1993 | Brokaw | |
| 6,725,436 B2 | 4/2004 | Koike et al. | |
| 7,663,470 B2 * | 2/2010 | Kimura | 338/195 |
| 7,714,694 B2 * | 5/2010 | Landsberger et al. | 338/9 |
| 7,825,768 B2 * | 11/2010 | Onishi | 338/195 |
| 7,968,826 B2 * | 6/2011 | DeAngelis et al. | 219/494 |
| 2005/0212650 A1 * | 9/2005 | Shovlin et al. | 338/195 |
| 2011/0025452 A1 * | 2/2011 | Maher | 338/195 |

* cited by examiner

*Primary Examiner* — James Harvey
(74) *Attorney, Agent, or Firm* — Cesari and McKenna, LLP

(57) ABSTRACT

A trimmable component network of switched parallel paths is described, each path contains a component, typically a resistor, with a portion of the component bypassed by fuses. The bypassed portion represents the same percentage of the component's value for each of the trimmable components in the parallel paths. A component is measured against a specification and if the specification is not met a prescribed number of fuses are cut to bring the component within its specification. A TRIM CODE may be used to identify the specific fuses to be cut, and thus the specific fuses that are to remain intact. The same TRIM CODE is applied to the components in the parallel paths.

20 Claims, 2 Drawing Sheets

US 8,143,993 B2

METHOD AND CIRCUIT FOR RECYCLING TRIMMED DEVICES

FIELD OF THE INVENTION

The present invention is related to trimming circuit components formed on chips to meet specifications, and, more particularly, to networks sharing trim values or codes to meet specifications.

BACKGROUND

On production runs of a chip, slight process variations may introduce changes that, over time and/or with other circumstances, cause the circuitry on the chip to not meet their specifications. Such changes may include, but are not limited to, chemical and composition differences, chip physical differences, photo-lithographic differences, pressure and temperature differences, etc. Each of these differences may be slight, but they may accumulate in such a way as to bring the circuitry out of specification.

One approach to recovering out-of-specification chips is to trim components on the chip. Often a parameter, e.g., a voltage, current, a resistance, or a frequency, is measured on the chip in question, and, if the measurement does not meet the specification, a trim is applied to components in the circuit so that that parameter meets its specification. The trim often applies to series arrangement of resistors with metallic connections or fuses shorting out some of the components. The fuses are selectively cut to change the resulting resistance. For example, a VCO (voltage controlled oscillator) may have an RC (resistor/capacitor) delay that determines the frequency of the VCO. The resistance may be trimmed to have the VCO meet its frequency specification.

SUMMARY OF THE INVENTION

The present disclosure includes a network of components including parallel paths. Each path includes a component that is physically shorted out over a portion of its length by one or more fuses. The value of the component portion that is not shorted out may be measured and compared to a specification. If out of specification, the component value may be changed by selectively cutting the fuses.

The specific fuses to be cut may be identified with a code, referred to as TRIM CODE. The code may be a binary code, but other codes may be used, e.g., a one to one code where each code bit identifies a fuse and a one would indicate a fuse to be cut.

The same code then may be applied to the components in parallel paths such that the percentage change to the parallel components match that in the component that was first trimmed. Moreover, the same code may be used in other trimmable networks on the same chip.

Illustratively, a component value, not in the network, may be measured that, when compared to a specification, indicates a specific trim code that may be applied to fuses in other component networks to have them meet their specifications.

One or more programmable switches may be placed in series with each parallel path in a component network, wherein closing a switch places the trimmed components in parallel with each other.

The present disclosure may apply to resistors, FETs, capacitors, virtually any component that is defined by a physical length on a chip, wherein the portions of the length may be shorted out by a fuse that may be subsequently cut.

BRIEF DESCRIPTION OF THE DRAWINGS

The invention description below refers to the accompanying drawings, of which.

DETAILED DESCRIPTION OF AN ILLUSTRATIVE EMBODIMENT

The present disclosure illustrates a trimmable component network of switched parallel paths each containing a component, typically a resistor, with a portion of the component bypassed by fuses. The bypassed portion may represent the same percentage of the component's value for each of the trimmable components in the parallel paths. A component is measured against a specification and, if the specification is not met, a prescribed number of fuses may be cut to bring the component within its specification. A TRIM CODE may be used to identify the specific fuses to be cut, and thus the specific fuses that are to remain intact. The same TRIM CODE is applied to the components in the parallel paths.

Figure 1:
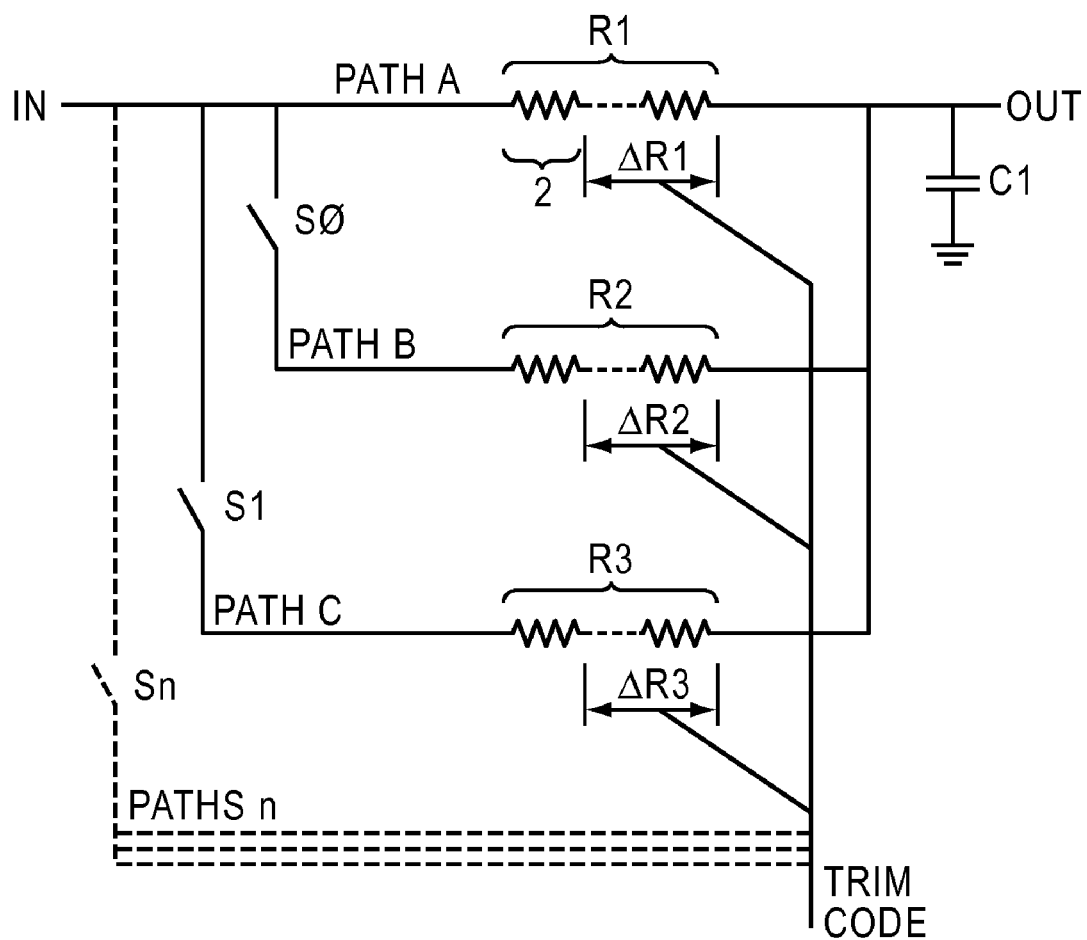
FIG. 1 is a schematic diagram of an example of the present disclosure.

FIG. 1 is a schematic diagram of an RC (resistor capacitor) delay circuit having an input, IN, an output, OUT, and three parallel paths, path A, path B, and path C. A switch S0 is programmable and when made, path B is placed in parallel with path A. Similarly switch S1 parallels path C with path A. When both S0 and S1 are made, paths A, B, and C are all in parallel. As illustrated the paths are joined at both ends of the respective paths, but the paths may be joined at one end only and the other ends could be connected to ground or some other node.

Note that additional paths, PATHSn with additional switches Sn, may be present, although only the three paths A, B, and C are further discussed herein.

Figure 2:
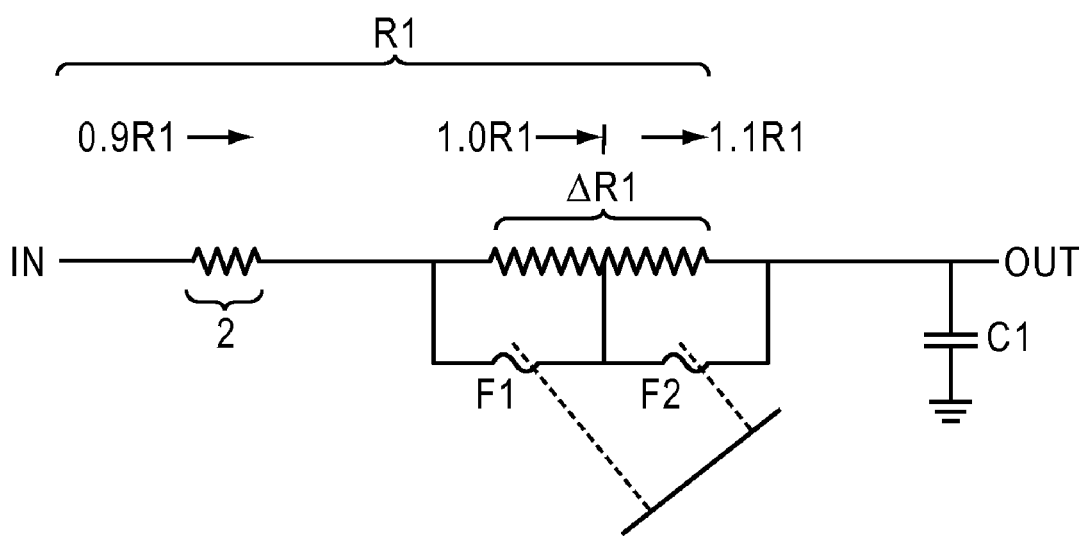
FIG. 2 is a detail schematic of the component from FIG. 1.

In path A resistor R1 comprises a portion $\Delta R1$ that is bypassed by fuses as shown in FIG. 2. R2 in path B and R3 in path C also have bypassed portions, $\Delta R2$ and $\Delta R3$, respectively.

In the example of FIG. 1, the resistance R1 in path A is measured from IN to OUT with intact fuses shorting out $\Delta R1$. In this example, with S0 and S1 open, the resistance measured between IN and OUT is only the unbypassed portion, 2, of R1. The measurement may be by introducing a time varying signal into the IN mode and measuring the output signal at OUT. The resulting time delay profile of the output signal may indicate that the R1, C1 circuit may not meet a specification. If so, a change to the resistance R1 from the IN to the OUT may be warranted. In FIG. 1, the capacitor C1 may be measured separately so that the percentage change in the value of R1 may be determined to bring the circuit into specification.

Note that the resistance R1 may be measured with an ohmmeter or other ways known to those skilled in the art.

FIG. 2 illustrates a detail of R1 from FIG. 1. In FIG. 2 R1 is assumed to have an in-specification nominal value. The unbypassed portion 2 of R1 is set to 0.9R1, and the value of $\Delta R1$ (if not bypassed) would bring the value of R1 up to 1.1R1 (10% above the nominal value R1). As shown, two fuses F1 and F2 bypass sections of $\Delta R1$. If F1 is cut, the resulting value of R1 is 1.0R1, and if then F2 is cut the resulting value is 1.1 R1. Note that FIG. 2 is illustrative and many more fuses may be used to bypass section of $\Delta R1$. For example, there may be 256 fuses across ΔR1, and the specific fuses to be cut or remain intact may be held as a code, referred to as a TRIM CODE.

Similarly the same TRIM CODE may be applied to ΔR2 and ΔR3, and to other trimmable networks on the same chip The resulting granularity of the trim code allows for very fine as well as gross adjustments. For example, if VR1 encompasses 20% of the maximum value of R1, then that 20% may be divided down by 8 bits or 256, wherein the selection granularity of changes to R1 would be less than 0.01% (20%/256). Note that ΔR1 may be arranged to be virtually any portion of the total R1 value as may be determined by the designer. For example, ΔR1 may be more than 50% or less than 1%. The same applies to ΔR2 and ΔR3.

Illustratively, a TRIM CODE may be eight bits wide where each position in the TRIM CODE refers to a specific fuse. That is there may be eight fuses along the length of ΔR1 and each fuse corresponds, one to one, with one of the eight bit positions. A one in a bit position may indicate that fuse to be cut with a zero meaning leave the fuse intact.

The amount of change required to R1 in order for the R1, C1 circuit to meets the specification is determined directly from how far the measurement misses the specification. For example, if the measured delay is 10% longer than the specification limit, R1 might be reduced by more than 10% to bring the delay within specification.

Still referring to FIG. 1, the TRIM CODE is related to the change required to bring the circuit into specification. In this example, the TRIM CODE is applied to all three resistors, R1, R2, and R3.

In operation, assuming R1 has been changed via the TRIM CODE to be within specifications. The TRIM CODE applied to ΔR1 was also applied to ΔR2 and ΔR3. Using the same TRIM CODE means that the trimmed R2 and the rimmed R3 will track the trimmed R1. Similarly, the trimmed delay of path A alone will be tracked by the delays when path B and/or path C are placed in parallel with path A by activating switches S0 and S1. Such operation reduces mismatches.

Illustratively, with respect to FIG. 2, after trimming with F1 cut and the corresponding fuses in path B and in path C cut, R1 may be set nominally at a value R1=R2=R, and R3 to R/2. With S0 closed and S1 opened, the resistance from IN to OUT is R/2, and with S0 open and S1 closed, the resistance from IN to OUT is about R/3. With both S0 and S1 closed the resistance form IN to OUT will be about R/4. As mentioned above, the paths are matched since the same TRIM CODE applies to R1, R2 and R3.

Figure 3:
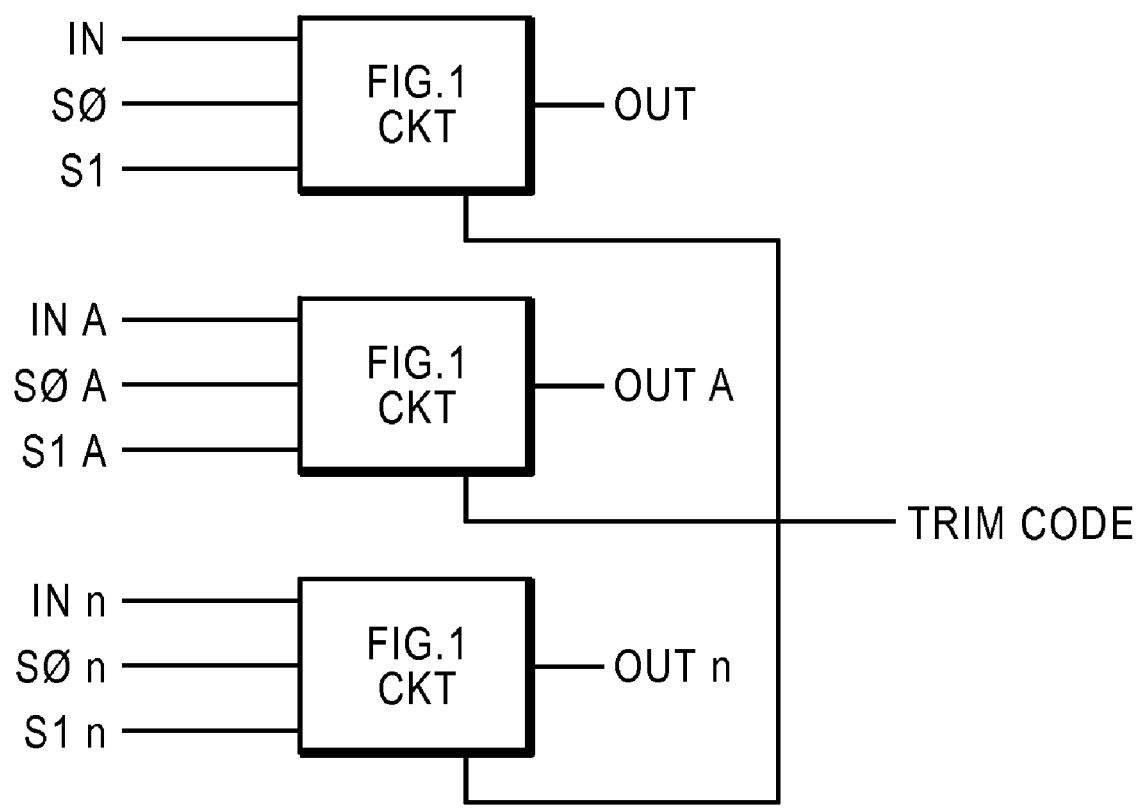
FIG. 3 illustrates groups of trimmable networks.

FIG. 3 illustrates another circuit configuration. Here a number of circuits as shown in FIG. 1 are arranged, each with different S0 and S1 switch activations. Here the same TRIM CODE applies to all the circuits providing matching, but the operation of S0 and S1 allows for a range of different delay s at the outputs (OUT, OUTA and OUTB).

The parallel arrangement shown in FIG. 1, preserves chip space, while allowing a range of TRIM CODES to be applied. Illustratively, 8 bits TRIM CODES may be used advantageously, but more bits or fewer bits may also be used to advantage.

What is claimed is:

1. A method for trimming a component network on a chip, the method comprising the steps of:
    arranging the component network as at least two parallel paths joined at least one end of each path, each path containing at least one component;
    fusing a portion of each component with one or more fuses, where the fusing bypasses, or shorts out, a portion of each component;
    determining that the component network does not meet its specification; and
    cutting one or more fuses in each parallel path so that the percentage change in each component is the same.

2. The method of claim 1 wherein the step of determining comprising the steps of measuring a component within the component network and comparing that measured component to its specification.

3. The method of claim 2 wherein a component outside the component network is measured and compared to its specification.

4. The method of claim 1 further comprising the step of expressing the amount of change as a percentage of the component value.

5. The method of claim 4 further comprising the step of expressing the percentage as a trim code.

6. The method of claim 4 further comprising the step holding the trim code as a digital number.

7. The method of claim 1 further wherein the step of fusing comprises:
    arranging each of the multiple fuses to bypass an equal portion of the component, and
    identifying each of the multiple fuses with the trim code.

8. The method of claim 3 further comprising the step of switching in or out each of the at least two parallel paths, leaving one path without a switch, wherein the components are in parallel with each other.

9. The method of claim 1 wherein the percentage change in each component ranges from less than 1% to more than 50%.

10. A method for trimming a resistor network on a chip, the method comprising the steps of:
    arranging the component network as at least two parallel paths joined at least one end of each path, each path containing at least one resistor;
    fusing a portion of each component, where the fusing bypasses, or shorts out, a portion of each resistor;
    measuring a component value within the resistor network;
    comparing the measured value to a specification;
    determining from the comparison that the resistor value does not meet the specification;
    developing from the comparison a percentage change to the resistor that will bring the resistor value into specification;
    expressing the percentage change as a trim code;
    cutting the fuses in each parallel path so that the percentage change in each resistor in each parallel path is the same, wherein each resistor in each path meets their specifications; and
    switching in or out each of the at least two parallel paths, leaving one path without a switch, wherein the components are in parallel with each other.

11. A component network comprising:
    at least two parallel paths joined at the ends of each path, each path containing at least one component;
    fuses bypassing the same percentage value of each component in each path; and
    a specification having a parameter value for each component, wherein the specification is met by having specific fuses cut for each component in each path.

12. The component network of claim 11 further comprising additional parallel components each having one of more fuses bypassing a portion of each of the components in the additional parallel components.

13. The component network of claim 11 further comprising a trim code, wherein the percentage of the component value may be expressed as a trim code.

14. The component network of claim 13 wherein the trim code is a digital number that identifies each fuse.

15. The component network of claim 11 wherein the bypassing fuses comprises multiple fuses, each of the multiple fuses bypassing the same percentage of each component.

16. The component network of claim 11 further comprising a switch in each of the parallel paths, leaving one path without a switch, wherein activating each switch either places the components in parallel with each other.

17. The component network of claim 11 wherein the percentage change of a component by cutting all fuses ranges from less than 1% to more than 50%.

18. The component network of claim 11 wherein the specification is for a component within the component network.

19. The component network of claim 11 wherein the specification is for a component outside the component network.

20. A resistor network comprising:
at least two parallel paths joined at least one end of each path, each path containing at least one resistor;
one of more intact fuses bypassing a portion of each resistor;
a trim code that identifies the intact fuses;
a switch in each parallel path but one, wherein an activated switch connects the corresponding parallel path in parallel to the one path without a switch; and
a specification having a parameter value for each resistor, wherein the intact exact fuses represent the same percentage of the resistor value for each resistor, wherein the specification is met.

* * * * *